(12) United States Patent
Fujii et al.

(10) Patent No.: US 11,108,028 B2
(45) Date of Patent: Aug. 31, 2021

(54) MANUFACTURING METHOD FOR ORGANIC ELECTRONIC DEVICE

(71) Applicant: SUMITOMO CHEMICAL COMPANY, LIMITED, Tokyo (JP)

(72) Inventors: Takashi Fujii, Niihama (JP); Shinichi Morishima, Tsukuba (JP); Yasuo Matsumoto, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 41 days.

(21) Appl. No.: 16/608,538

(22) PCT Filed: Apr. 20, 2018

(86) PCT No.: PCT/JP2018/016322
§ 371 (c)(1),
(2) Date: Oct. 25, 2019

(87) PCT Pub. No.: WO2018/198978
PCT Pub. Date: Nov. 1, 2018

(65) Prior Publication Data
US 2021/0111381 A1 Apr. 15, 2021

(30) Foreign Application Priority Data

Apr. 25, 2017 (JP) .............................. JP2017-086106

(51) Int. Cl.
*H01L 51/56* (2006.01)
*H01L 51/52* (2006.01)
(52) U.S. Cl.
CPC .......... *H01L 51/56* (2013.01); *H01L 51/5209* (2013.01); *H01L 51/5225* (2013.01); *H01L 51/5253* (2013.01); *H01L 2251/566* (2013.01)
(58) Field of Classification Search
None
See application file for complete search history.

(56) References Cited

U.S. PATENT DOCUMENTS

| 5,852,480 A | 12/1998 | Yajima et al. |
| 6,579,422 B1 | 6/2003 | Kakinuma |

(Continued)

FOREIGN PATENT DOCUMENTS

| EP | 2 906 023 A1 | 8/2015 |
| EP | 2 914 066 A1 | 9/2015 |

(Continued)

OTHER PUBLICATIONS

English translation of the International Search Report, dated Jul. 24, 2018, for International Application No. PCT/JP2018/016323.

(Continued)

*Primary Examiner* — J.E. Schoenholtz
(74) *Attorney, Agent, or Firm* — Birch, Stewart, Kolasch & Birch, LLP.

(57) ABSTRACT

A manufacturing method for an organic electronic device according to a mode includes a device substrate manufacturing step S01 of manufacturing a device substrate 12 in which a first electrode layer 18, a device function portion 20 including an organic layer, and a second electrode layer 22 are sequentially laminated in each of a plurality of device formation regions DA virtually set in a flexible support substrate 16 and having at least one corner, a bonding step S02 of bonding a sealing member 14 including a sealing base 24 and an adhesive layer 26 laminated on the sealing base to a side of the second electrode layer of the device substrate via the adhesive layer such that the sealing member is not disposed at corners c1 to c4 of the device formation region, and a dicing step S03 of dicing the device substrate, to which the sealing member is bonded, for each of the device formation regions to obtain an organic electronic device 10.

7 Claims, 11 Drawing Sheets

(56) References Cited

U.S. PATENT DOCUMENTS

| | | | |
|---|---|---|---|
| 6,744,120 B1* | 6/2004 | Yanagisawa | H01L 23/49572 257/668 |
| 2003/0082984 A1 | 5/2003 | Hayashi et al. | |
| 2006/0214282 A1* | 9/2006 | Sakata | H01L 23/4985 257/701 |
| 2006/0220541 A1 | 10/2006 | Koyama | |
| 2009/0091245 A1 | 4/2009 | Dings et al. | |
| 2012/0252147 A1* | 10/2012 | Takahashi | H01L 51/56 438/33 |
| 2012/0319570 A1 | 12/2012 | Sugahara et al. | |
| 2013/0002126 A1 | 1/2013 | Sakaguchi | |
| 2015/0255746 A1* | 9/2015 | Osaki | H05B 33/10 438/28 |
| 2015/0333112 A1 | 11/2015 | Kamimura et al. | |
| 2015/0352663 A1 | 12/2015 | Lee et al. | |
| 2019/0067626 A1 | 2/2019 | Shimogawara et al. | |
| 2019/0198807 A1* | 6/2019 | Liu | H01L 51/0094 |

FOREIGN PATENT DOCUMENTS

| | | |
|---|---|---|
| JP | 7-318980 A | 12/1995 |
| JP | 8-220559 A | 8/1996 |
| JP | 10-62735 A | 3/1998 |
| JP | 2003-133068 A | 5/2003 |
| JP | 2006-278213 A | 10/2006 |
| JP | 2006-294536 A | 10/2006 |
| JP | 2007-294137 A | 11/2007 |
| JP | 2008-77854 A | 4/2008 |
| JP | 2011-40336 A | 2/2011 |
| JP | 2015-215952 A | 12/2015 |
| JP | 2015-216072 A | 12/2015 |
| JP | 2016-513019 A | 5/2016 |
| JP | 2016-149223 A | 8/2016 |
| JP | 6053221 B1 | 12/2016 |
| JP | 2017-8350 A | 1/2017 |
| WO | WO 01/05194 A1 | 1/2001 |
| WO | WO 2011/108113 A1 | 9/2001 |
| WO | WO 2011/070841 A1 | 6/2011 |
| WO | WO 2013/042532 A1 | 3/2013 |
| WO | WO 2015/016082 A1 | 2/2015 |
| WO | WO 2016/136008 A1 | 9/2016 |
| WO | WO 2016/178370 A1 | 11/2016 |

OTHER PUBLICATIONS

International Preliminary Report on Patentability and English translation of the Written Opinion of the International Searching Authority, dated Nov. 7, 2019, for International Application No. PCT/JP2018/016323.

Japanese Office Action, dated Mar. 27, 2018, for Japanese Application No. 2017-087392, with an English translation.

Japanese Office Action, dated Nov. 7, 2017, for Japanese Application No. 2017-087392, with an English translation.

Extended European Search Report for European Application No. 18791288.6, dated Dec. 23, 2020.

Extended European Search Report for European Application No. 18791974.1, dated Dec. 22, 2020.

International Preliminary Report on Patentability and English translation of the Written Opinion of the International Searching Authority for International Application No. PCT/JP2018/016322, dated Nov. 7, 2019.

International Search Report for International Application No. PCT/JP2018/016322, dated Jul. 17, 2018.

Japanese Office Action for Japanese Application No. 2017-086106, dated Feb. 27, 2018, with English translation.

Japanese Office Action for Japanese Application No. 2017-086106, dated Oct. 17, 2017, with English translation.

U.S. Office Action, dated Aug. 5, 2020, for U.S. Appl. No. 16/608,650.

U.S. Office Action for U.S. Appl. No. 16/608,650, dated Oct. 20, 2020.

* cited by examiner (a)

(b)

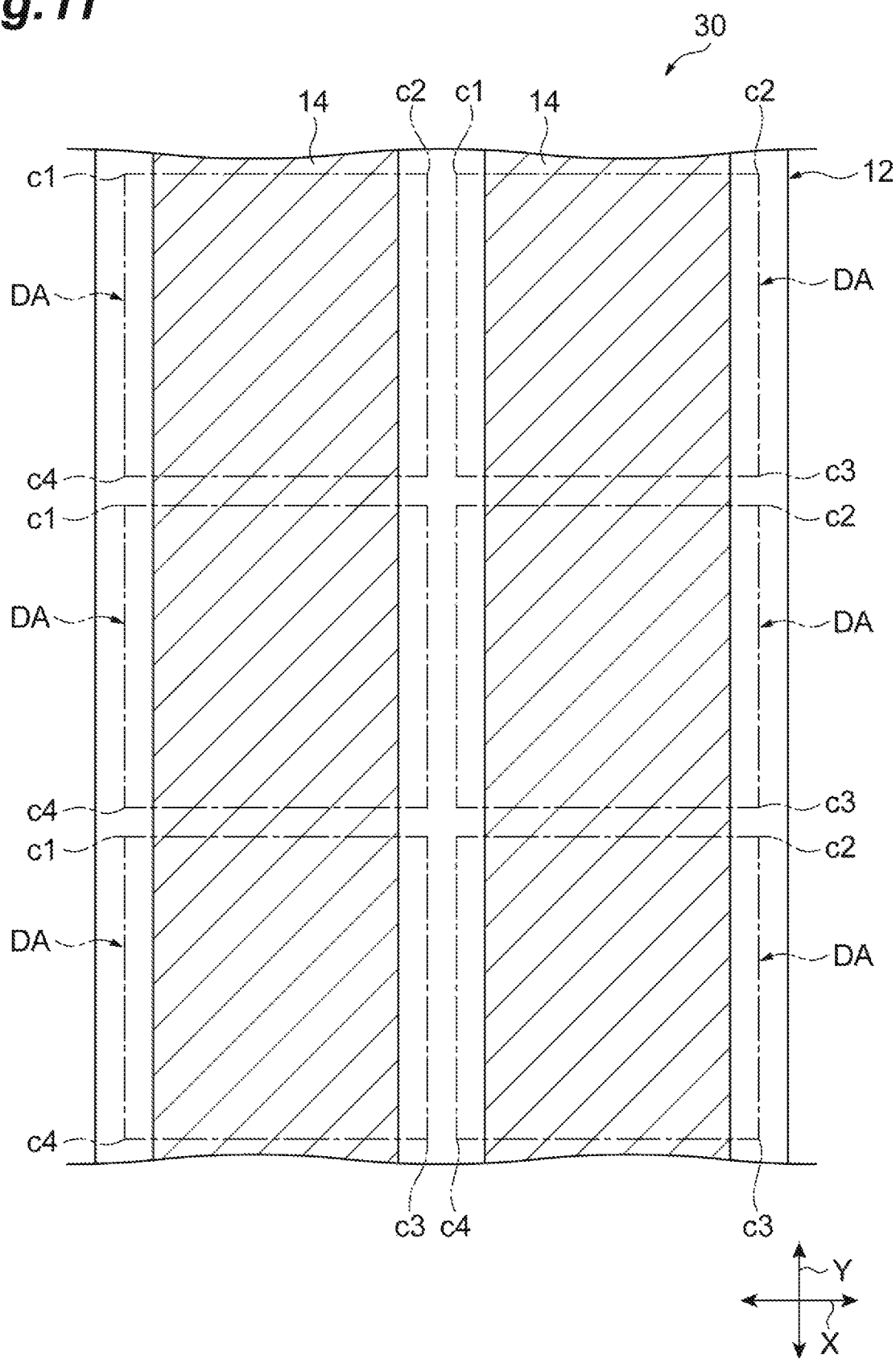

MANUFACTURING METHOD FOR ORGANIC ELECTRONIC DEVICE

TECHNICAL FIELD

The present invention relates to a manufacturing method for an organic electronic device.

BACKGROUND ART

An organic electronic device generally includes a device substrate, configured by sequentially laminating a first electrode layer, a device function portion including an organic layer, and a second electrode on a support substrate, and a sealing member bonded to the device substrate for preventing deterioration of the organic layer. In order to manufacture such an organic electronic device efficiently, it is conceivable to apply the technique of Patent Literature 1, for example. That is, first, a base material sheet in which a plurality of organic electronic devices to be manufactured are integrated is manufactured. Then, the base material sheet is cut for each of the organic electronic devices included in the base material sheet to obtain the organic electronic device to be manufactured. In such a method, a plurality of organic electronic devices can be manufactured by performing one manufacturing step.

CITATION LIST

Patent Literature

Patent Literature 1: Japanese Unexamined Patent Publication No. 2016-513019

SUMMARY OF INVENTION

Technical Problem

When the base material sheet in which the plurality of organic electronic devices to be manufactured are integrated is manufactured, if the sealing member is bonded over a region corresponding to the individual device substrate, the time required for the bonding step of the sealing member can be shortened. However, when the organic electronic devices are diced from the base material sheet, the sealing member is present at a corner of the organic electronic device. Thus, for example, if the organic electronic device is dropped from the corner, an impact tends to be concentrated at the corner due to the dropping, so that the sealing member is deformed or peeled off, causing a problem that a sealing performance is deteriorated.

Thus, an object of the present invention is to provide a manufacturing method for an organic electronic device which can prevent deterioration of sealing performance while aiming at improvement of productivity.

Solution to Problem

A manufacturing method for an organic electronic device according to one aspect of the present invention, includes a device substrate manufacturing step of manufacturing a device substrate in which a first electrode layer, a device function portion including an organic layer, and a second electrode layer are sequentially laminated in each of a plurality of device formation regions virtually set in a flexible support substrate and having at least one corner, a bonding step of bonding a sealing member including a sealing base and an adhesive layer laminated on the sealing base to a side of the second electrode layer of the device substrate via the adhesive layer such that the sealing member is not disposed at the corner of the device formation region, and a dicing step of dicing the device substrate, to which the sealing member is bonded, for each of the device formation regions to obtain an organic electronic device.

In the above manufacturing method, a plurality of the organic electronic devices can be obtained by performing the device substrate manufacturing step, the bonding step, and the dicing step once, so that productivity can be improved. In the bonding step, the sealing member is bonded to the device substrate via the adhesive layer such that the sealing member is not disposed at the corner of the device formation region. Thus, the sealing member is not present at the corner of the organic electronic device obtained in the dicing step. Thus, even if the manufactured organic electronic device is dropped from the corner, peeling of the sealing member and deformation of the sealing member are unlikely to occur in the vicinity of the corner, so that deterioration of sealing performance of the organic electronic device can be suppressed.

In the dicing step, the device substrate to which the sealing member is bonded may be cut for each of the device formation regions by a cutting blade having a shape corresponding to a shape of the device formation region. In this case, since the device formation region can be efficiently separated from the device substrate which has been subjected to the bonding step, productivity of the organic electronic device is further improved.

In the dicing step, a cutting blade may be advanced from a side of the sealing member to a side of the support substrate of the device substrate to which the sealing member is bonded. In this case, since the adhesive layer is pressed toward the support substrate as the cutting blade advances, the sealing member can be prevented from peeling from the device substrate in the dicing step.

The sealing base may be a metal foil. By using a metal foil, it is possible to further prevent moisture from entering the organic layer of the device function portion. For example, in a mode in which the device substrate which has been subjected to the bonding step is cut by the cutting blade for each of the device formation regions, force tends to be concentrated at the corner of the device formation region. Thus, if the sealing member in which the sealing base is a metal foil is present at the corner of the device formation region, the metal foil may be deformed at the time of cutting with the cutting blade, and a short circuit may occur between the first electrode layer and the second electrode layer through the metal foil. On the other hand, in the bonding step of the manufacturing method for an organic electronic device according to the present invention, the sealing member is bonded to the device substrate via the adhesive layer such that the sealing member is not disposed at the corner of the device formation region. Thus, the short circuit as described above can be prevented.

In one embodiment, when the four corners of the device formation region of the device substrate are referred to as a first corner, a second corner, a third corner, and a fourth corner, the first to fourth corners may be arranged in order of the first corner, the second corner, the third corner, and the fourth corner around a circumferential direction of the device formation region, a portion of the first electrode layer may be disposed at each of the first corner and the fourth corner, and a portion of the second electrode layer may be disposed at each of the second corner and the third corner.

In one embodiment, an example of a plan view shape of the device formation region is quadrilateral.

The sealing member may have an opening at a position facing the corner of the device formation region. In this case, in the bonding step, the opening is aligned with the corner of the device formation region, so that the sealing member can be bonded to the device substrate without being disposed in a portion of the corner of the device formation region.

The support substrate may extend in one direction, the plurality of device formation regions may be arranged along the one direction of the support substrate, and in the bonding step, the sealing member in which a length in a direction orthogonal to the extending direction of the support substrate is shorter than a length of the device formation region may be bonded to the device substrate. In this case, for example, processing such as forming an opening in the sealing member in order not to dispose the sealing member at the corner of the device formation region is unnecessary, so that the sealing member can be easily prepared.

Advantageous Effects of Invention

The present invention can provide a manufacturing method for an organic electronic device which can prevent deterioration of the sealing performance while aiming at improvement of the productivity.

BRIEF DESCRIPTION OF DRAWINGS

FIG. 11 is a drawing for explaining another example of the bonding step.

DESCRIPTION OF EMBODIMENTS

Figure 1:
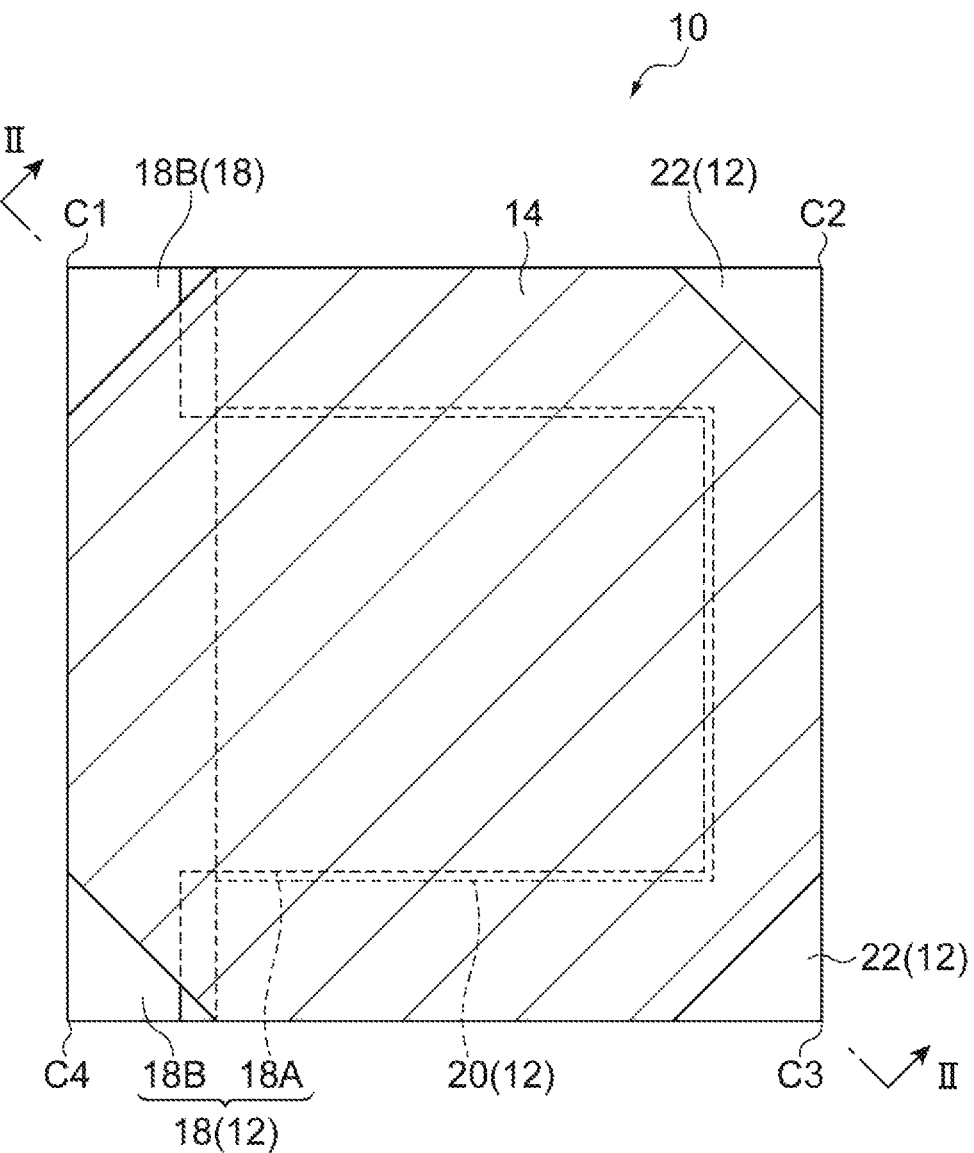
FIG. 1 is a plan view of an organic EL device manufactured by a manufacturing method for the organic EL device (organic electronic device) according to an embodiment.

Hereinafter, an embodiment of the present invention will be described with reference to the drawings. Identical or corresponding elements will be referenced by identical reference signs and description thereof will not be repeated. Dimensional ratios of the drawings do not always coincide with those of the description. In the description, terms indicating directions such as "above" and "below" are convenient terms based on a state illustrated in the drawing.

Figure 2:
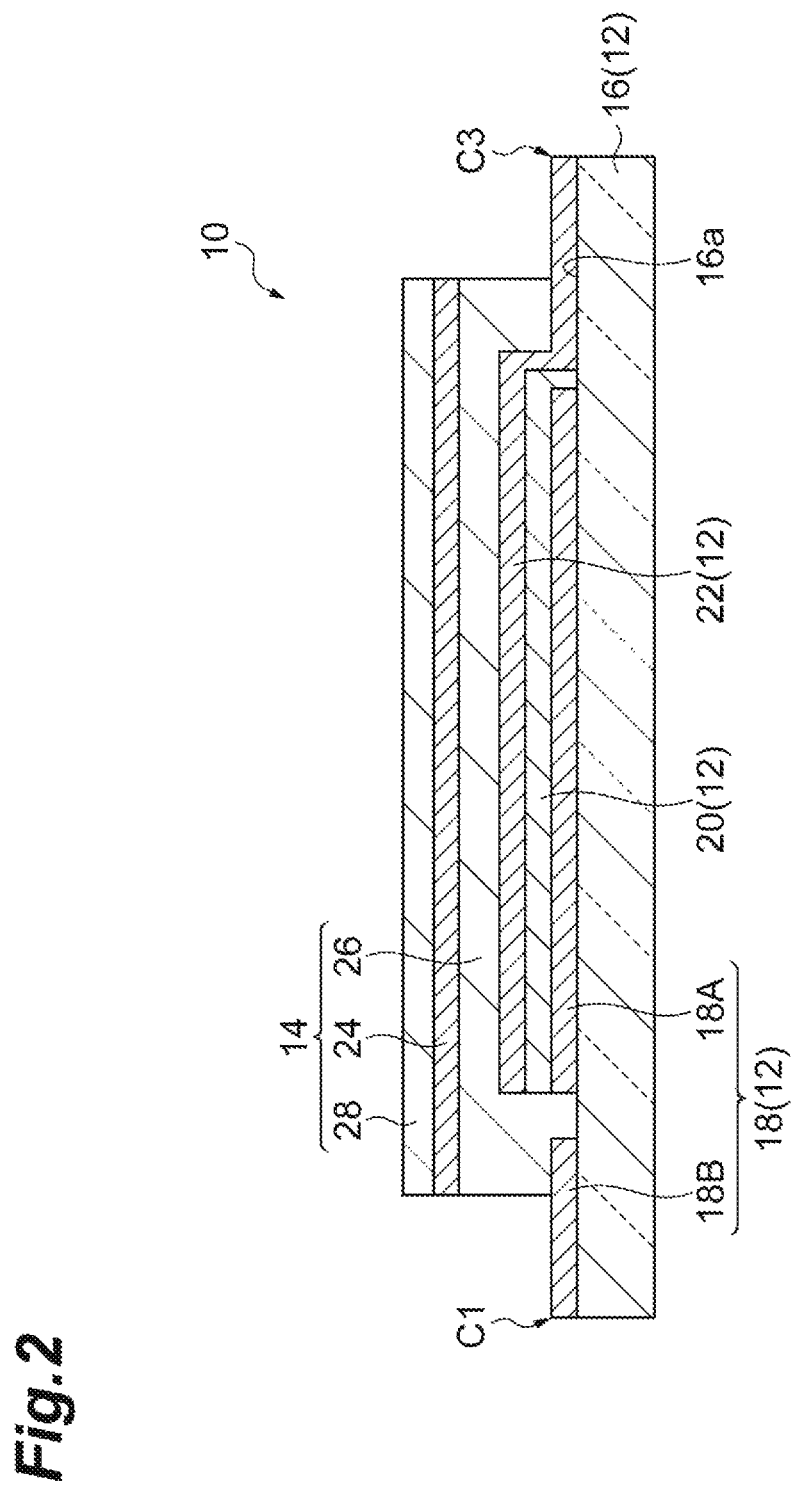
FIG. 2 is a cross-sectional view taken along the line II-II of FIG. 1.

As shown in FIGS. 1 and 2, an organic EL device 10 manufactured by a manufacturing method for an organic EL device (organic electronic device) of the present embodiment includes a device substrate 12 and a sealing member 14. The organic EL device 10 is, for example, an organic EL lighting panel used for lighting. In FIG. 1, the sealing member 14 is hatched to clearly show the sealing member 14. FIG. 2 is a cross-sectional view taken along the line II-II of FIG. 1, and the hatching in FIG. 2 shows the cross section of each component.

The organic EL device 10 has four corners C1, C2, C3, and C4. A plan view shape of the organic EL device 10 (a shape as viewed from a thickness direction of the device substrate 12) is not limited to a square as shown in FIG. 1, but may be a rectangle. Each of the corners C1 to C4 may be slightly rounded.

In the following, unless otherwise stated, the organic EL device 10 of a bottom emission type will be described. However, the organic EL device 10 may be a top emission type device. X and Y directions orthogonal to each other shown in FIG. 1 may be used for the convenience of description. The X and Y directions are orthogonal to the thickness direction of the device substrate 12.

[Device Substrate]

The device substrate 12 has a support substrate 16 and an anode layer (first electrode layer) 18, an organic EL portion (device function portion including an organic layer) 20, and a cathode layer (second electrode layer) 22 which are sequentially provided on the support substrate 16. The anode layer 18, the organic EL portion 20, and the cathode layer 22 are main portions of the organic EL device 10. Accordingly, the device substrate 12 corresponds to a support substrate with a main body in which the main body is provided on the support substrate 16.

(Support Substrate)

The support substrate 16 is translucent to visible light (light with a wavelength of 400 nm to 800 nm) and has flexibility. The flexibility is a property that the substrate (the support substrate 16 in the present embodiment) is not sheared or broken even when a predetermined force is applied to the substrate and the substrate can be bent. The support substrate 16 can be in the form of a film. The support substrate 16 is, for example, a plastic film. Examples of the material of the support substrate 16 include polyether sulfone (PES); polyester resins such as polyethylene terephthalate (PET) and polyethylene naphthalate (PEN); polyolefin resins such as polyethylene (PE), polypropylene (PP), and a cyclic polyolefin; polyamide resins; polycarbonate resins; polystyrene resins; polyvinyl alcohol resins; saponified products of an ethylene vinyl acetate copolymer; polyacrylonitrile resins; acetal resins; polyimide resins; and epoxy resins.

From the viewpoint of high heat resistance, a low linear expansion coefficient, and a low manufacturing cost, a polyester resin or a polyolefin resin among the above-mentioned resins is preferably used as the material of the support substrate 16, and a polyethylene terephthalate or polyethylene naphthalate is more preferably used. These resins may be used alone or in combination of two or more types thereof.

The thickness of the support substrate 16 is, for example, 30 μm or more and 500 μm or less. When the support substrate 16 is made of resin, the thickness of the support substrate 16 is preferably 45 μm or more from the viewpoint of preventing twists, wrinkles, and elongation of the substrate when the substrate is continuously conveyed by a roll-to-roll method, and the thickness of the support substrate 16 is preferably 125 µm or less from the viewpoint of flexibility.

A barrier layer having a moisture barrier function may be disposed on one surface 16a (see FIG. 2) of the support substrate 16.

The barrier layer may have a gas barrier function. In the bottom emission type organic EL device 10, a surface opposite to the one surface 16a of the support substrate 16 functions as a light emitting surface.

(Anode Layer)

The anode layer 18 is disposed on the one surface 16a of the support substrate 16. In the present embodiment, the anode layer 18 is in the form of a T and has a first region 18A located at a center of the support substrate 16 and a second region 18B extending along an edge of the support substrate 16. As shown in FIG. 1, in the Y direction, a length of the first region 18A is shorter than a length of the support substrate 16. In the X direction, the length of the anode layer 18 (the sum of the lengths of the first region 18A and the second region 18B) is shorter than the length of the support substrate 16. The second region 18B is integrally connected to the first region 18A. In the Y direction, the length of the second region 18B is substantially the same as the length of the support substrate 16. In the Y direction, one end of the second region 18B is located near the corner C1, and the other end is located near the corner C4.

A light transmitting electrode layer is used for the anode layer 18. As the light transmitting electrode layer, a thin film containing metal oxide, metal sulfide, metal, or the like having high electric conductivity can be used. A thin film having high light transmittance is suitably used for the anode layer 18. For example, a thin film formed of indium oxide, zinc oxide, tin oxide, indium tin oxide (abbreviated to ITO), indium zinc oxide (abbreviated to IZO), gold, platinum, silver, copper, or the like can be used. Among these, a thin film formed of ITO, IZO, or tin oxide can be suitably used.

As the anode layer 18, a transparent conductive film of an organic material such as polyaniline and derivatives thereof or polythiophene and derivatives thereof may be used. The anode layer 18 may have a network structure in which conductors (for example, metals) are arranged in a network (including a mesh pattern).

The thickness of the anode layer 18 can be determined in consideration of light transmitting properties, electric conductivity, and the like. The thickness of the anode layer 18 usually ranges from 10 nm to 10 µm, preferably ranges from 20 nm to 1 µm, and more preferably ranges from 50 nm to 200 nm.

(Organic EL Portion)

The organic EL portion 20 is a function portion that contributes to light emission of the organic EL device 10, such as charge transfer and charge recombination, according to voltage applied to the anode layer 18 and the cathode layer 22. The organic EL portion 20 is disposed on the anode layer 18. The organic EL portion 20 covers the anode layer 18 so as to expose the second region 18B side of the anode layer 18. In FIG. 1, the organic EL portion 20 is disposed so as to expose the second region 18B and a portion of the first region 18A on the second region 18B side and cover the other portion.

The organic EL portion 20 has a light emitting layer. The light emitting layer is a functional layer having a function of emitting light (including visible light). The light emitting layer usually mainly includes an organic material emitting at least one of fluorescence and phosphorescence or the organic material and a dopant material assisting the organic material. Thus, the light emitting layer is an organic layer. For example, the dopant material is added to improve emission efficiency or to change an emission wavelength. The organic material may be a low-molecular compound or a high-molecular compound. The thickness of the light emitting layer ranges, for example, from 2 nm to 200 nm.

As an organic material which is a light emitting material mainly emitting at least one of fluorescence and phosphorescence, the following pigment-based materials, metal complex-based materials, and polymer-based materials can be mentioned, for example.

(Pigment-Based Materials)

Examples of the pigment-based materials include cyclopentamine derivatives, tetraphenyl butadiene derivative compounds, triphenyl amine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex-Based Materials)

Examples of the metal complex-based materials include metal complexes having, as a central metal, a rare-earth metal such as Tb, Eu and Dy, Al, Zn, Be, Ir, Pt, or the like and having, as a ligand, a structure of oxadiazole, thiadiazole, phenylpyridine, phenylbenzimidazole, quinoline, or the like. Examples of the metal complex-based materials may include metal complexes that emit light from the triplet excited state such as iridium complexes and platinum complexes; aluminumquinolinol complexes; benzoquinolinole beryllium complexes; benzoxazolyl zinc complexes; benzothiazole zinc complexes; azomethyl zinc complexes; porphyrin zinc complexes; and phenanthroline europium complexes.

(Polymer-Based Materials)

Examples of the polymer-based materials include polyparaphenylene vinylene derivatives, polythiophene derivatives, polyparaphenylene derivatives, polysilane derivatives, polyacetylene derivatives, polyfluorene derivatives, polyvinyl carbazole derivatives, and materials obtained by polymerizing the pigment-based materials or the metal complex-based light-emitting materials described above.

(Dopant Materials)

Examples of the dopant materials include perylene derivatives, coumarin derivatives, rubrene derivatives, quinacridone derivatives, squarylium derivatives, porphyrin derivatives, styryl pigments, tetracene derivatives, pyrazolone derivatives, decacyclene and phenoxazon.

The organic EL portion 20 may have various functional layers in addition to the light emitting layer. Examples of the functional layer disposed between the anode layer 18 and the light emitting layer include a hole injection layer and a hole transport layer. Examples of the functional layer disposed between the cathode layer 22 and the light emitting layer include an electron injection layer and an electron transport layer. The hole injection layer is a functional layer having a function of improving hole injection efficiency from the anode layer 18 to the light emitting layer. The hole transport layer is a functional layer having a function of improving the hole injection efficiency to the light emitting layer from the anode layer 18, the hole injection layer, or a portion of the hole transport layer which is closer to the anode layer 18. The electron transport layer is a functional layer having a function of improving the electron injection efficiency to the light emitting layer from the cathode layer 22, the electron injection layer, or a portion of the electron transport layer which is closer to the cathode layer 22. The electron injection layer is a functional layer having a function of improving electron injection efficiency from the cathode layer 22 to the light emitting layer.

An example of a layer configuration of the organic EL portion 20 is shown below. In the example of the layer configuration described below, the anode layer and the cathode layer are also described in parentheses in order to show an arrangement relationship between the anode layer 18, the cathode layer 22, and various functional layers.

(a) (Anode layer)/light emitting layer/(cathode layer)

(b) (Anode layer)/hole injection layer/light emitting layer/(cathode layer)

(c) (Anode layer)/hole injection layer/light emitting layer/electron injection layer/(cathode layer)

(d) (Anode layer)/hole injection layer/light emitting layer/electron transport layer/electron injection layer/(cathode layer)

(e) (Anode layer)/hole injection layer/hole transport layer/light emitting layer/(cathode layer)

(f) (Anode layer)/hole injection layer/hole transport layer/light emitting layer/electron injection layer/(cathode layer)

(g) (Anode layer)/hole injection layer/hole transport layer/light emitting layer/electron transport layer/electron injection layer/(cathode layer)

(h) (Anode layer)/light emitting layer/electron injection layer/(cathode layer)

(i) (Anode layer)/light emitting layer/electron transport layer/electron injection layer/(cathode layer) A symbol "/" means that layers on both sides of the symbol "/" are bonded to each other.

A known material may be used as a material of functional layers (such as a hole injection layer, a hole transport layer, an electron injection layer, and an electron transport layer) other than the light emitting layer, possessed by the organic EL portion 20. The thickness of the functional layer of the organic EL portion 20 has different optimum values depending on a material to be used, and is determined in consideration of electric conductivity, durability, and the like. The electron injection layer may be a portion of the cathode layer 22.

(Cathode Layer)

The cathode layer 22 is disposed on the organic EL portion 20 so as not to be in contact with the anode layer 18. In the present embodiment, the cathode layer 22 is also provided in the vicinity of each of the corners C2 and C3. The cathode layer 22 may have a laminated structure in which two or more layers are laminated. Based on the mode of FIG. 1, an example of an arrangement state of the cathode layer 22 will be specifically described.

In the Y direction, the length of the cathode layer 22 is the same as the length of the support substrate 16. In the X direction, the cathode layer 22 is provided from a position of one edge of the cathode layer 22 (an edge of the cathode layer 22 on the second region 18B side of the anode layer 18) to a position of an edge on the right side in FIG. 1 (an edge located on the first region 18A side of the anode layer 18) in the support substrate 16. Thus, a portion of the cathode layer 22 is in contact with the one surface 16a of the support substrate 16. In FIG. 1, the position of the one edge (an edge on the left side in FIG. 1) of the cathode layer 22 is the same as the position of the corresponding edge of the organic EL portion 20. However, the position of the one edge of the cathode layer 22 may be located inside (the right side in FIG. 1) of the corresponding edge of the organic EL portion 20.

In order for the light from the organic EL portion 20 to be reflected by the cathode layer 22 and delivered to the anode layer 18 side, the material of the cathode layer 22 is preferably a material having a high reflectance to the light from the organic EL portion 20. As a material of the cathode layer 22, for example, alkali metals, alkaline-earth metals, transition metals, and the metals of Group 13 of the Periodic Table are used. Specific examples of the material of the cathode layer 22 include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys of two or more types of these metals, alloys of one or more types of these metals and one or more types of gold, silver, platinum, copper, manganese, titanium, cobalt, nickel, tungsten, and tin, and graphite or graphite intercalation compounds. Examples of the alloys include magnesium-silver alloys, magnesium-indium alloys, magnesium-aluminum alloys, indium-silver alloys, lithium-aluminum alloys, lithium-magnesium alloys, lithium-indium alloys and calcium-aluminum alloys.

For the cathode layer 22, for example, a transparent conductive electrode made of a conductive metal oxide, a conductive organic substance, or the like may be used. Specific examples of the conductive metal oxide include indium oxide, zinc oxide, tin oxide, ITO, and IZO. Examples of the conductive organic substance include polyanilines and derivatives thereof, and polythiophenes and derivatives thereof.

The thickness of the cathode layer 22 is set in consideration of electric conductivity, durability, and the like. The thickness of the cathode layer 22 usually ranges from 10 nm to 10 µm, preferably ranges from 20 nm to 1 µm, and more preferably ranges from 50 nm to 500 nm.

[Sealing Member]

The sealing member 14 is disposed in an uppermost part in the organic EL device 10. The sealing member 14 has a metal foil (sealing base) 24, an adhesive layer 26, and a resin film 28, as shown in FIG. 2. In the present embodiment, a mode in which the sealing member 14 has the resin film 28 will be described, but the sealing member 14 may have the metal foil 24 and the adhesive layer 26.

The metal foil 24 functions as a barrier layer having a moisture barrier function. The metal foil 24 may have a gas barrier function. As a metal foil, a copper foil, an aluminum foil, and a stainless steel foil are preferable from the viewpoint of barrier property. It is preferable that the thickness of the metal foil 24 be large from the viewpoint of suppressing pin holes, and the thickness preferably ranges from 10 µm to 50 µm in consideration of flexibility.

The adhesive layer 26 is laminated on one surface of the metal foil 24 and is used to bond the metal foil 24 to the device substrate 12.

Specifically, the adhesive layer 26 contains a photocurable or thermosetting acrylate resin, a photocurable or thermosetting epoxy resin, or a photocurable or thermosetting polyimide resin. A resin film which can be bonded by an impulse sealer which is generally used, for example, a thermo-adhesive film such as an ethylene vinyl acetate copolymer (EVA) film, a polypropylene (PP) film, a polyethylene (PE) film, or a polybutadiene (PB) film, may be used for the adhesive layer 26. Thermoplastic resins such as vinyl acetate type, polyvinyl alcohol type, acrylic, polyethylene type, epoxy type, and cellulose type, a cyclohexane ring-containing saturated hydrocarbon resin, and a styrene-isobutylene modified resin can also be used for the adhesive layer 26. For the adhesive layer 26, a pressure sensitive adhesive (PSA) that can be easily attached due to adhesiveness can also be used. The pressure sensitive adhesive (PSA) has a property of adhering to a surface of another member only by applying pressure for a short time.

The adhesive layer 26 may contain hygroscopic fine particles. Examples of the hygroscopic fine particles include metal oxides which cause a chemical reaction with moisture at normal temperature, and zeolites which physically adsorb moisture.

The thickness of the adhesive layer 26 preferably ranges from 1 µm to 100 µm, more preferably ranges from 5 µm to 60 µm, and still more preferably ranges from 10 µm to 30 µm. The moisture content of the adhesive layer 26 is preferably 300 ppm or less (by weight).

The resin film 28 is laminated on the other surface of the metal foil 24 (a surface opposite to the surface in contact with the adhesive layer 26). Examples of the material of the resin film 28 include polyethylene terephthalate (PET) and polyimide (PI).

When viewed from the thickness direction of the support substrate 16, as shown in FIGS. 1 and 2, the sealing member 14 has a shape that covers the organic EL portion 20 and does not cover but exposes the corners C1, C2, C3 and C4. In other words, the sealing member 14 has a shape in which, from a sealing member having the same shape as a plan view shape of the support substrate 16, a corner of the sealing member is chamfered. Thus, the anode layer 18 is exposed from the sealing member 14 near the corner C1 and the corner C4, and the cathode layer 22 is exposed from the sealing member 14 near the corner C2 and the corner C3. In the anode layer 18 and the cathode layer 22, a portion exposed from the sealing member 14 can be used as an external connection region for connecting the anode layer 18 and the cathode layer 22 to the outside.

Figure 3:
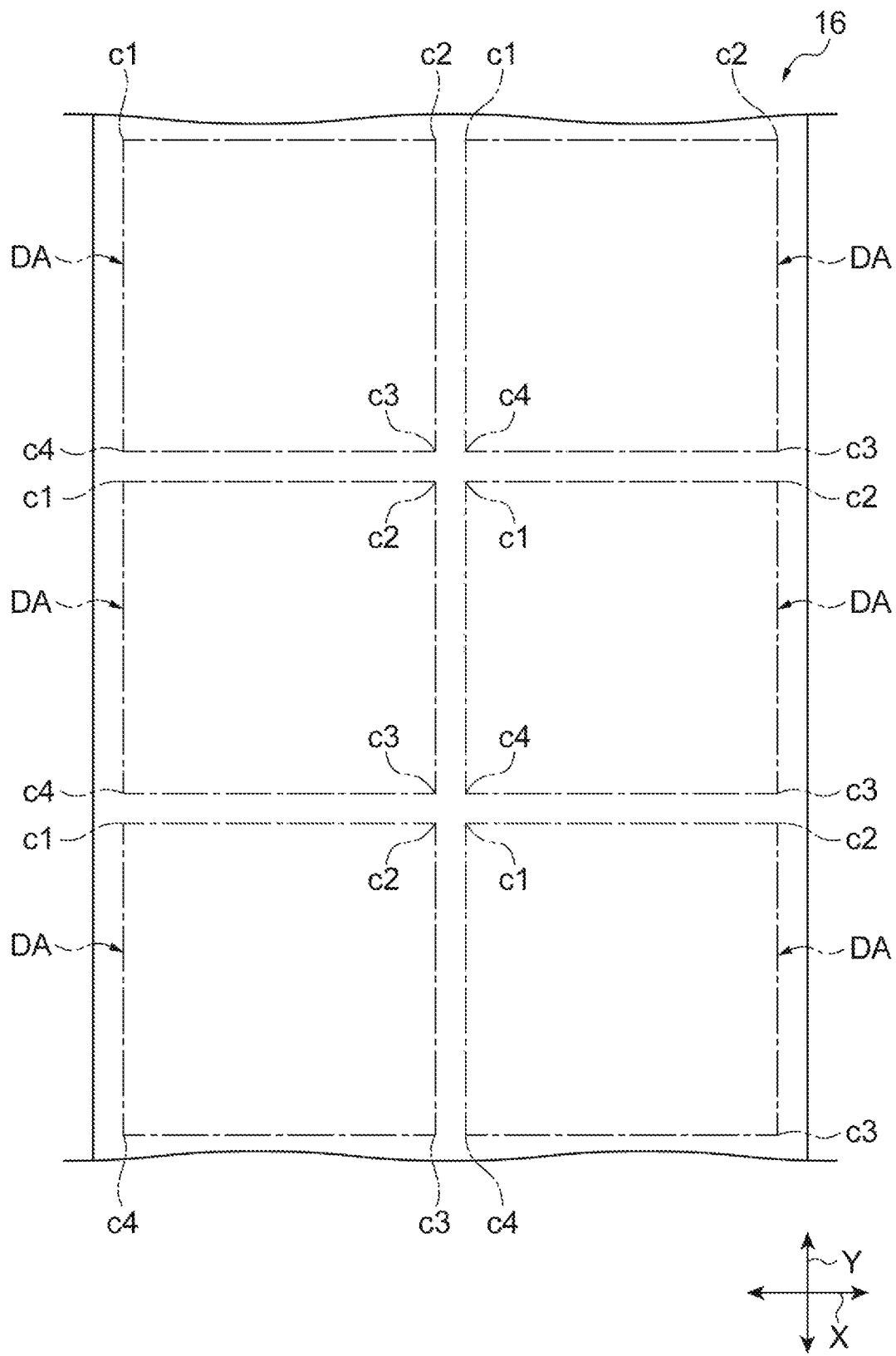
FIG. 3 is a plan view of a support substrate used in the manufacturing method for the organic EL device (organic electronic device) according to an embodiment.

Next, a mode in which the organic EL device 10 is manufactured using the elongated support substrate 16 shown in FIG. 3 will be described. In this specification, an elongated substrate refers to a substrate which extends in one direction (extending direction) and in which the length in the extending direction is longer than the length in a direction (width direction) orthogonal to the extending direction. FIG. 3 show the X direction and the Y direction corresponding to the X direction and the Y direction of FIG. 1. The same applies to FIGS. 5 to 7 and 11.

When the organic EL device 10 is manufactured using the elongated support substrate 16, a plurality of device formation regions DA are virtually set on the support substrate 16. The shape and size of the device formation region DA correspond to the shape and size of the organic EL device 10 to be manufactured shown in FIG. 1. The size of the device formation region DA may be a product size. A corner c1 (first corner), a corner c2 (second corner), a corner c3 (third corner), and a corner c4 (fourth corner) of each of the device formation regions DA correspond respectively to a corner C1, a corner C2, a corner C3, and a corner C4 of the organic EL device 10. The corner c1, the corner c2, the corner c3 and the corner c4 are arranged in this order around the circumferential direction of the device formation region DA. When viewed from the thickness direction of the support substrate 16, the corner of the device formation region DA is a region in which, when an organic EL device in which a top of the shape of the device formation region DA is included and a sealing member is disposed at the top is dropped, a load (impact) that may cause deformation of the sealing member to the extent that the sealing performance is deteriorated may be applied. Here, the top is a portion including a vertex or a portion including a region (corner circle) in which the periphery of the vertex is rounded. The width of the corner is appropriately set depending on the material of the sealing member.

When the plurality of device formation regions DA arranged along the extending direction of the elongated support substrate 16 are referred to as a device formation region row, FIG. 3 exemplifies a case where two device formation region rows are set in the width direction of the support substrate 16 (a direction orthogonal to the extending direction). The number of the device formation region rows in the width direction of the support substrate 16 may be one or three or more.

Figure 4:
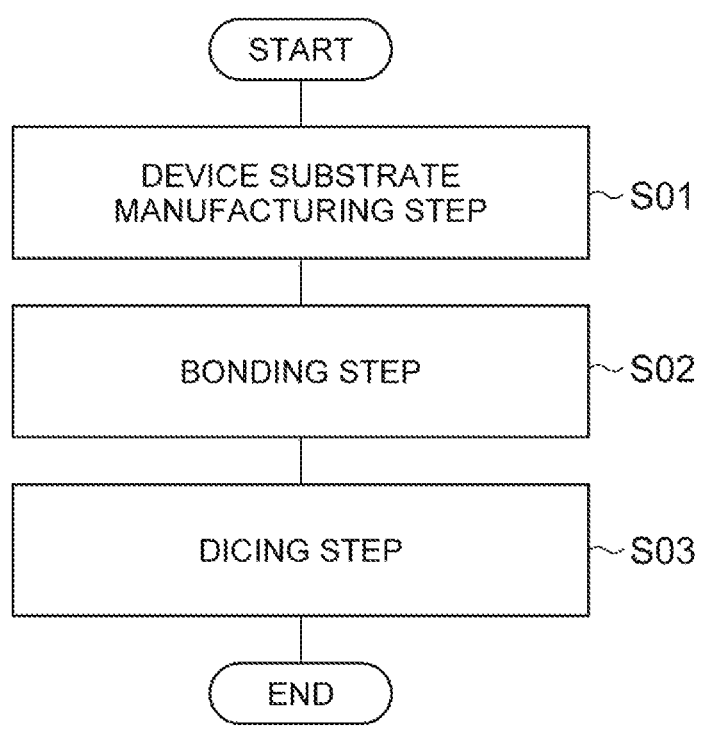
FIG. 4 is a flowchart of the manufacturing method for the organic EL device (organic electronic device) according to an embodiment.

The manufacturing method for an organic EL device includes a device substrate manufacturing step S01, a bonding step S02, and a dicing step S03, as shown in FIG. 4. Hereinafter, unless otherwise stated, the manufacturing method for the organic EL device will be described using a roll-to-roll method. In this case, the device substrate manufacturing step S01, the bonding step S02, and the dicing step S03 are performed while conveying the elongated support substrate 16 in the longitudinal direction.

[Device Substrate Manufacturing Step]

Figure 5:
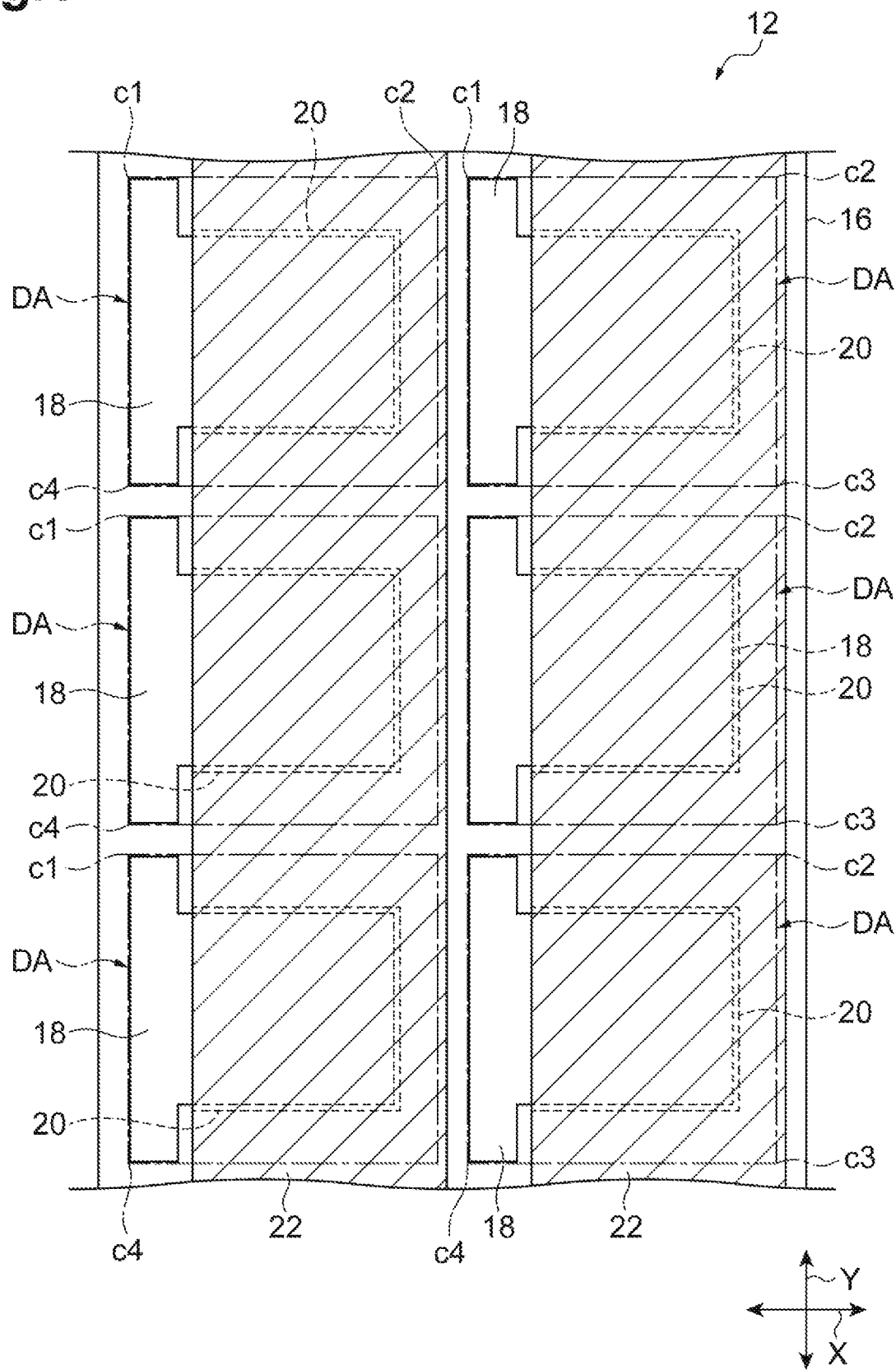
FIG. 5 is a drawing for explaining a device substrate manufacturing step.

The device substrate manufacturing step S01 includes an anode layer forming step, an organic EL portion forming step, and a cathode layer forming step. In the device substrate manufacturing step S01, by sequentially performing the above steps, as shown in FIG. 5, the elongated device substrate 12 in which the anode layer 18, the organic EL portion 20, and the cathode layer 22 are sequentially laminated on each of the device formation regions DA is manufactured. In FIG. 5, the cathode layer 22 is hatched to clearly show the cathode layer 22.

(Anode Layer Forming Step)

In the anode layer forming step, the anode layer 18 is formed in each of the device formation regions DA. In the anode layer forming step, the anode layer 18 is formed such that while a portion of the anode layer 18 is disposed at each of the corners c1 and c4, the anode layer 18 is not disposed at the corners c2 and c3. The shape of the anode layer 18 and the arrangement state in the device formation region DA are the same as those described with reference to FIG. 1. The anode layer 18 can be formed by a dry film formation method, a plating method, a coating method, or the like. Examples of the dry film formation method include a vacuum evaporation method, a sputtering method, an ion plating method, and a CVD method. Examples of the coating method include an inkjet printing method, a slit coating method, a microgravure coating method, a gravure coating method, a bar coating method, a roll coating method, a wire bar coating method, a spray coating method, a screen printing method, a flexographic printing method, an offset printing method, and a nozzle printing method. When the anode layer 18 is formed by the coating method, the inkjet printing method is preferable among the above examples.

(Organic EL Portion Forming Step)

In the organic EL portion forming step, the organic EL portion 20 is formed on the anode layer 18 of each of the device formation regions DA. The shape of the organic EL portion 20 and the arrangement state in the device formation region DA are the same as those described with reference to FIG. 1. An example of a method of forming the organic EL portion 20 is the same as that of the anode layer 18. When the organic EL portion 20 is formed while conveying the elongated support substrate 16, it is preferable to form the organic EL portion 20 using an inkjet printing method. When the organic EL portion 20 is a laminate of a plurality of functional layers, the functional layers may be formed in order from the functional layer on the anode layer 18 side.

(Cathode Layer Forming Step)

In the cathode layer forming step, the cathode layer 22 is formed on the organic EL portion 20. In the cathode layer forming step, the cathode layer 22 is formed such that while a portion of the cathode layer 22 is disposed at each of the corners c2 and c3, the cathode layer 22 is not disposed at the corners c1 and c4. Specifically, as shown in FIG. 5, the stripe-like cathode layer 22 extending in the extending direction of the support substrate 16 is formed so that the cathode layer 22 is disposed as shown in FIG. 1 in each of the device formation regions DA for each of the device formation regions. In other words, the cathode layer 22 is formed over the plurality of device formation regions DA constituting the device formation region row. An example of a method of forming the cathode layer 22 is the same as that of the anode layer 18.

In the mode shown in FIG. 5, the position of one edge of the cathode layer 22 in the X direction (the edge of the cathode layer 22 on the side of the second region 18B of the anode layer 18 in FIG. 1) is the same as the position of the corresponding edge of the organic EL portion 20. The position of the other edge of the cathode layer 22 formed in the cathode layer forming step opposite to the above one edge may be the same as the position of the corresponding edge of the device formation region DA, or, as shown in FIG. 5, the other edge may be located outside the corresponding edge of the device formation region DA. The cathode layer 22 may be formed to cover at least a portion of the second region 18B of the anode layer 18 formed in the device formation region DA located adjacent in the X direction if the cathode layer 22 does not cover one edge of the organic EL portion 20 (the edge of the organic EL portion 20 on the side of the second region 18B of the anode layer 18 in FIG. 1) formed in the device formation region DA located adjacent in the X direction.

When the stripe-like cathode layer 22 is formed, the time required for the cathode layer forming step can be easily shortened, so that the productivity of the organic EL device 10 is improved.

[Bonding Step]

Figure 6:
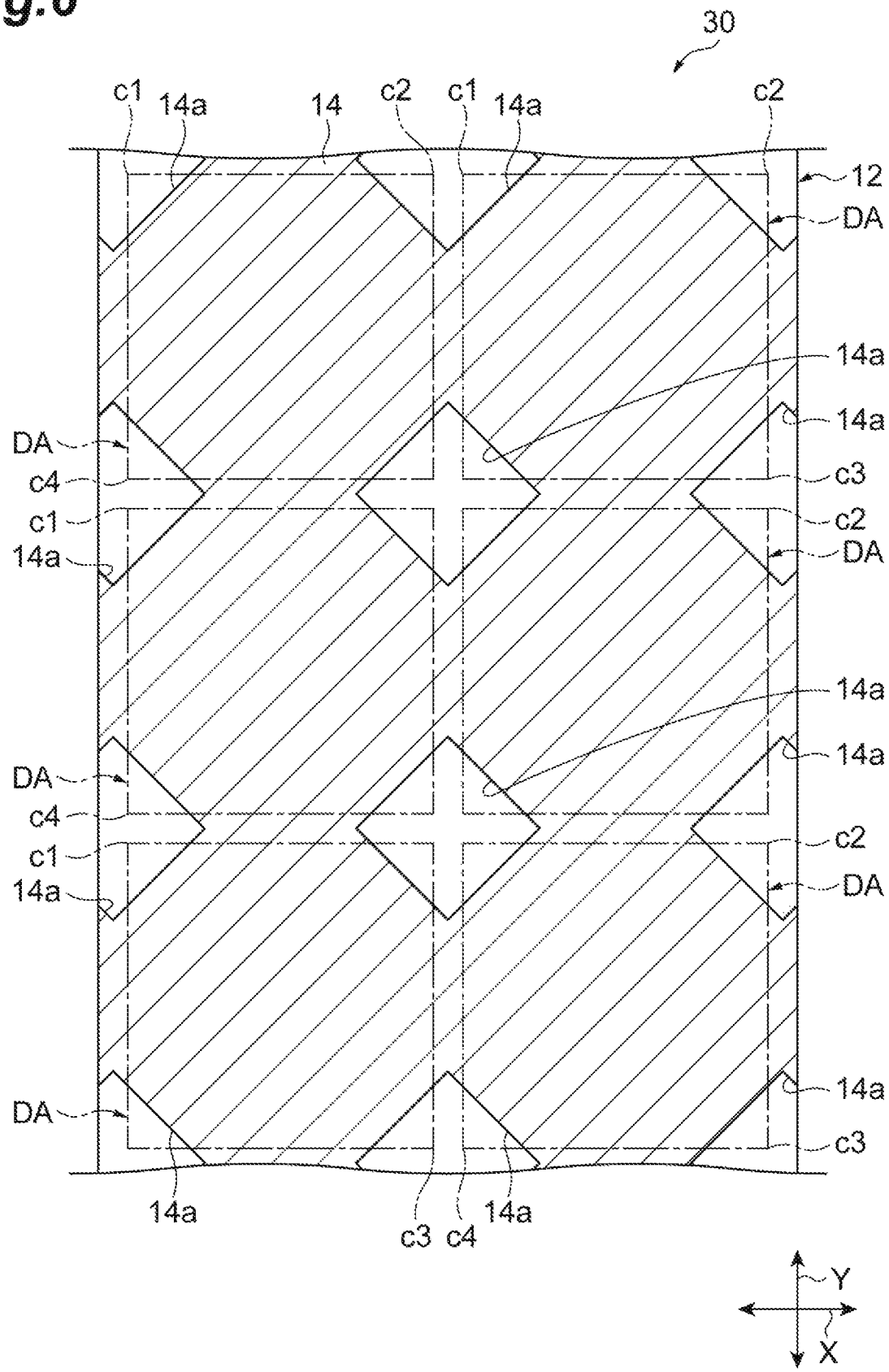
FIG. 6 is a drawing for explaining a bonding step.
Figure 7:
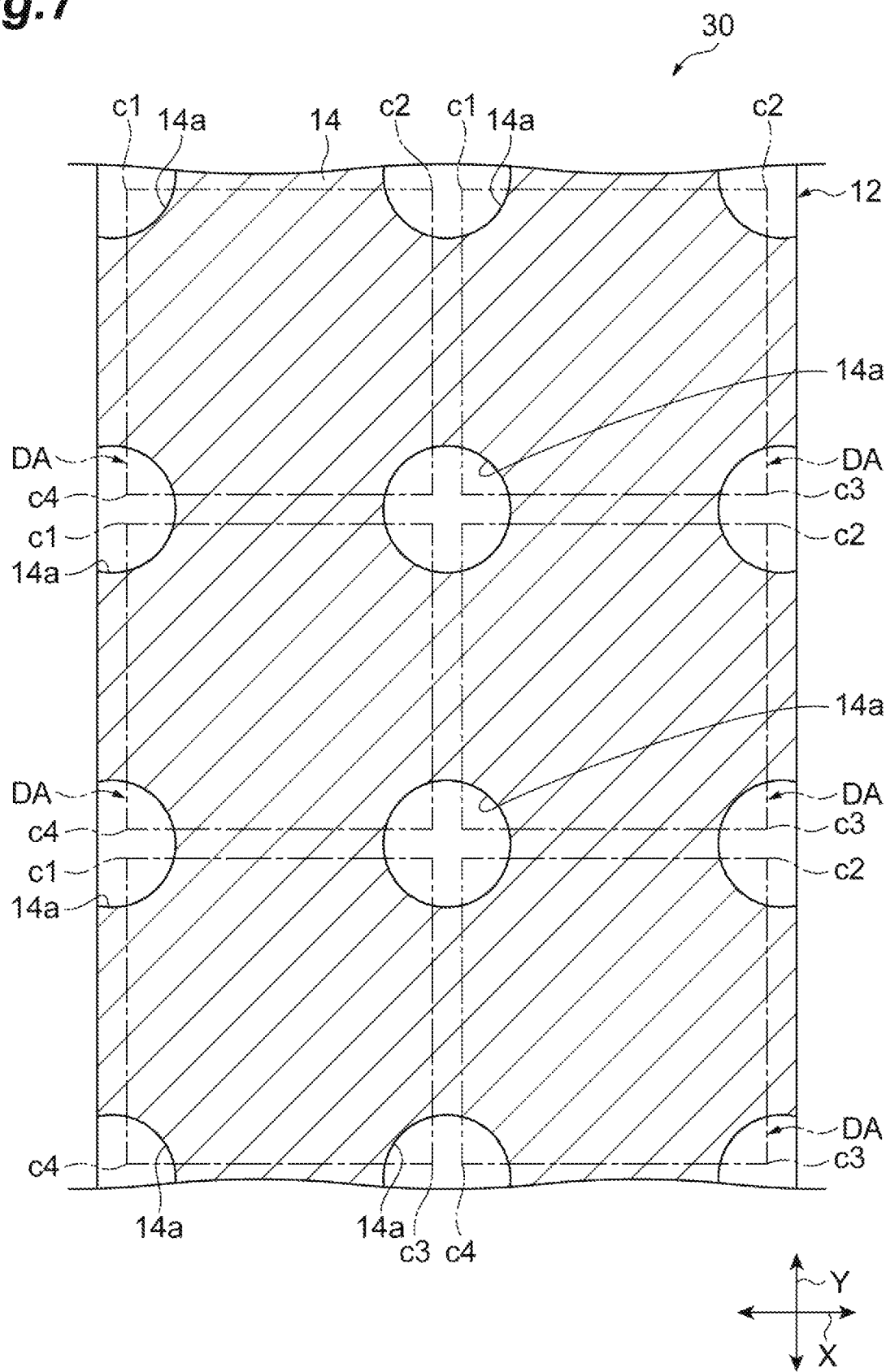
FIG. 7 is a drawing for explaining another example of a sealing member used in the bonding step.

In the bonding step S02, the elongated sealing member 14 is bonded onto the elongated device substrate 12, manufactured in the device substrate manufacturing step S01, from the cathode layer 22 side of the device substrate 12 via the adhesive layer 26. As shown in FIG. 6, the sealing member 14 used in the bonding step S02 is a sealing member in which openings 14a are formed at positions facing the corners c1, c2, c3, and c4 of the device formation region DA. Such a sealing member 14 can be produced, for example, by forming a laminate in which the adhesive layer 26 and the resin film 28 are provided on one side and the other side of the elongated metal foil 24 and then forming holes through the laminate. The shape of the opening 14a shown in FIG. 6 is a rhombus corresponding to the organic EL device 10 of FIG. 1. However, the shape of the opening 14a is not limited as long as the opening 14a is formed such that the sealing member 14 is not disposed at the positions of the corners c1 to c4 of the device formation region DA (in other words, such that the portions of the corners c1 to c4 of the device substrate 12 are exposed). For example, as shown in FIG. 7, the shape of the opening 14a may be circular. The size of the opening 14a is not limited as long as the corners c1 to c4 are exposed by the opening 14a and a region covering the organic EL portion 20 of the device substrate 12 can be secured in a portion of the sealing member 14 other than the opening 14a.

In FIGS. 6 and 7, the sealing member 14 is hatched to clearly show the sealing member 14. In FIGS. 6 and 7, in order to facilitate understanding of the relationship between the corners c1 to c4 of the device formation region DA and the sealing member 14, illustration of the anode layer 18, the organic EL portion 20 and the cathode layer 22 provided in the device substrate 12 is omitted.

In the bonding step S02, while conveying the sealing member 14 having the opening 14a and the device substrate 12 in the longitudinal direction, the device substrate 12 and the sealing member 14 are aligned and superposed such that the cathode layer 22 of the device substrate 12 and the adhesive layer 26 face each other and the openings 14a are located on the corners c1 to c4 of the device formation region DA. In that state, the device substrate 12 and the sealing member 14 are heated and pressurized to be bonded to each other. For example, the device substrate 12 and the sealing member 14 may be fed between two heating rollers thinning a pair and heated and pressurized by the two heating rollers.

By going through the bonding step S02, the organic EL device 10 shown in FIG. 1 is formed for each of the device formation regions DA. Thus, the device substrate 12 to which the sealing member 14 is bonded is also referred to as a base material sheet 30. The base material sheet 30 is elongated and includes a plurality of the organic EL devices 10 to be manufactured.

[Dicing Step]

In the dicing step S03, the base material sheet 30 (the device substrate 12 to which the sealing member 14 is bonded) obtained through the bonding step S02 is cut with an outer edge (boundary) of the device formation region DA as a cutting line for each of the device formation regions DA to obtain the plurality of organic EL devices 10 independent of one another.

Figure 8:
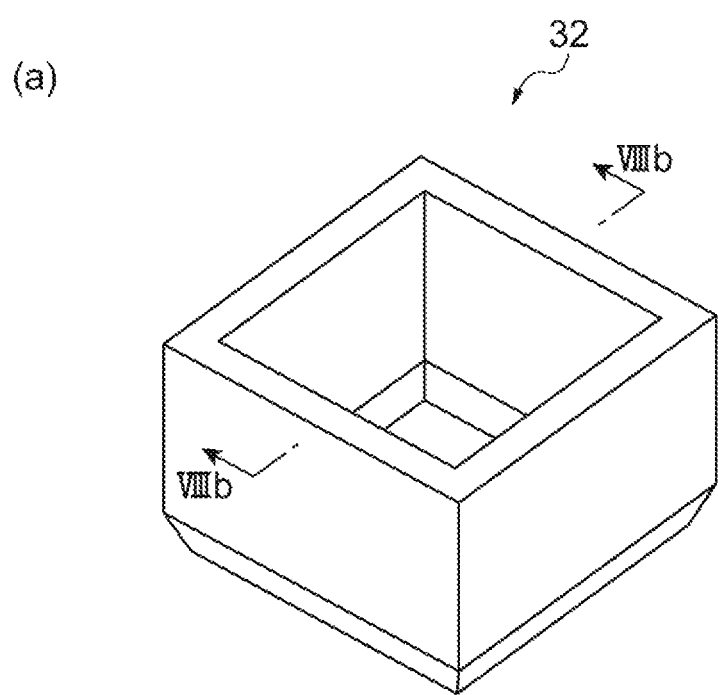
FIG. 8 is a drawing for explaining a cutting blade used in a dicing step, where an (a) part of FIG. 8 shows a perspective view of the cutting blade, and a (b) part of FIG. 8 is a cross-sectional view taken along the line VIIIb-VIIIb of the (a) part.
Figure 8:
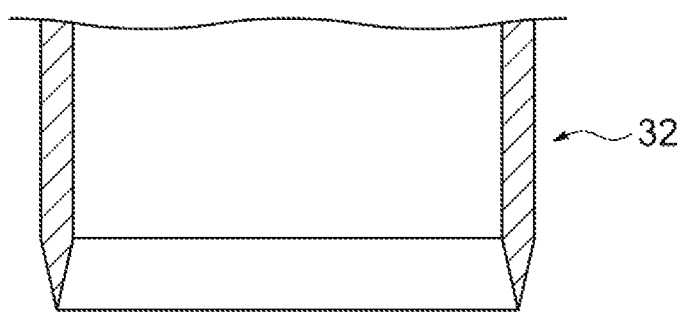

In the dicing step S03 of the present embodiment, a cutter provided with the cutting blade 32 shown in FIG. 8 is used. Specifically, the base material sheet 30 is cut for each of the device formation regions DA by punching out a portion of the device formation region DA of the base material sheet 30 with the cutting blade 32. In FIG. 8, an (a) part is a perspective view schematically showing an outer shape of the cutting blade 32, and a (b) part is a cross-sectional view taken along the line VIIIb-VIIIb of the (a) part. As shown in the (a) part of FIG. 8, the cutting blade 32 used for punching has a shape corresponding to the shape of the device formation region DA and corners which are in contact with the corners c1 to c4 of the device formation region DA at the time of cutting. The cutting blade 32 may have substantially the same shape as the shape of the device formation region DA as viewed from the advancing direction of the cutting blade 32 so as to punch through the device formation region DA. In the present embodiment, since the device formation region DA has a quadrilateral shape such as a square or a rectangle, the cutting blade 32 has a frame shape as shown in FIG. 8.

In the dicing step S03, the cutting blade 32 may be advanced from the sealing member 14 side to the support substrate 16 side in the device substrate 12 to which the sealing member 14 is bonded, and the portion of the device formation region DA may be cut. At this time, from the viewpoint of suppressing bending of the base material sheet 30, it is preferable that the device substrate 12 be supported by a support (stage). In order to prevent damage to the support and the cutting blade 32 while reliably cutting the device substrate 12 to which the sealing member 14 is bonded, it is preferable that a hole for receiving the cutting blade 32 be formed in the support.

In the manufacturing method for the organic EL device, the plurality of device formation regions DA are set on the elongated support substrate 16, and the organic EL device 10 is formed in each of the device formation regions DA. Thereafter, the plurality of organic EL devices 10 are separated. Thus, the plurality of organic EL devices 10 are obtained by performing the device substrate manufacturing step S01 to the dicing step S03 shown in FIG. 4 once. Thus, the productivity of the organic EL device 10 is improved.

In the manufacturing method for the organic EL device, as shown in FIG. 1, it is possible to manufacture the organic EL device 10 in which, in a plan view shape, the sealing member 14 is not disposed near the corners C1, C2, C3, and C4.

If the sealing member is disposed near the corners C1 to C4, when the organic EL device is dropped from any of the corners C1 to C4, the sealing base of the sealing member may be deformed by an impact, or the sealing member may peel from the device substrate. This is because the impact at the time of drop tends to be concentrated at the corners C1 to C4. If the sealing base is deformed or the sealing member peels from the device substrate, the sealing performance may be deteriorated. In addition, for example, if the sealing base has a property that it is hard to return to an original state when deformed, like a metal foil, for example, installability is reduced when the manufactured organic EL device is incorporated into another device or installed in a predetermined place.

In the organic EL device 10 manufactured by the manufacturing method for the organic EL device, the vicinity of the corners C1, C2, C3, and C4 is not covered by the sealing member 14. Thus, the deformation of the metal foil 24, the peeling of the sealing member 14 from the device substrate 12, and the like as described above are unlikely to occur, so that the deterioration of the sealing performance can be suppressed. In addition, when the organic EL device 10 is dropped from any of the corners C1 to C4, not the sealing member 14 but the corner of the support substrate 16 receives an impact. Since the support substrate 16 is flexible, the support substrate 16 is unlikely to be damaged and is easily restored even if it is temporarily deformed when dropped. Thus, reduction of the installability of the organic EL device 10 can also be suppressed.

In the dicing step S03 of the present embodiment, as shown in FIG. 8, the organic EL device 10 is separated from the base material sheet 30 using the cutting blade 32 having the corner. In this case, the organic EL device 10 can be separated from the base material sheet 30 by causing the cutting blade 32 to enter the base material sheet 30 once, so that the dicing step S03 can be performed efficiently. In particular, when the dicing step S03 is performed while conveying the device substrate 12, it is possible to suppress a decrease in the conveyance speed, so that it is easy to improve the efficiency of the dicing step S03.

When the cutting blade 32 shown in FIG. 8 is used, if the sealing member 14 is present at the corners c1, c2, c3 and c4 of the device formation region DA, a short circuit may occur between the anode layer and the cathode layer of the organic EL device through the metal foil 24 of the sealing member 14. This is considered to be because, since force tends to be concentrated at the corner of the cutting blade 32, the metal foil 24 of the sealing member 14 is deformed at the time of cutting and is in contact with the anode layer and the cathode layer.

On the other hand, in the above manufacturing method, in order to manufacture the organic EL device 10 in which the sealing member 14 is not disposed near the corners C1, C2, C3 and C4, in the bonding step S02, as shown in FIG. 5, the sealing member 14 in which the openings 14a are Banned in the regions facing the corners el to c4 of the device formation region DA is bonded to the device substrate 12. Thus, even if the cutting blade 32 shown in FIG. 8 is used, a short circuit between the anode layer 18 and the cathode layer 22 through the metal foil 24 of the sealing member 14 can be prevented. As a result, the manufacturing yield of the organic EL device 10 can be improved. The verification experiment which verified this point is described.

Figure 9:
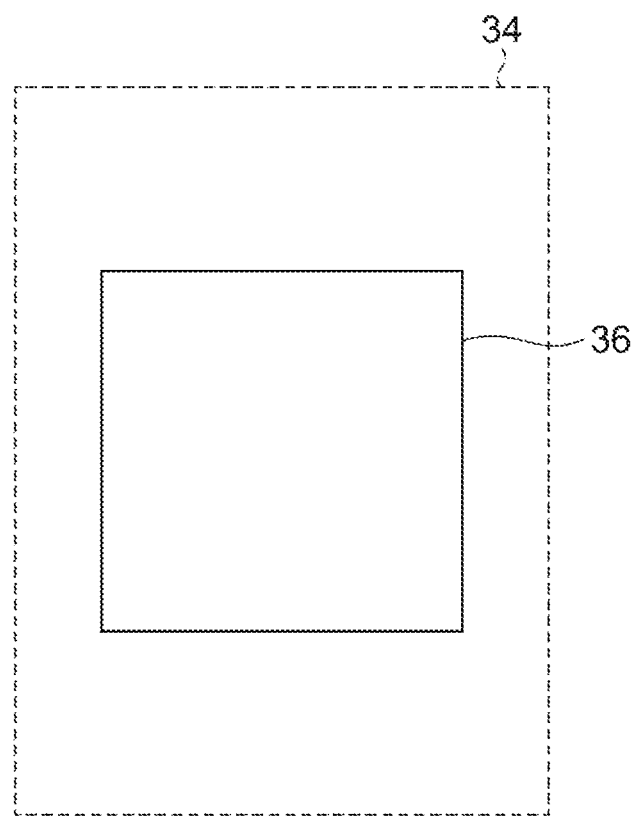
FIG. 9 is a drawing for explaining a verification experiment.

In the verification experiment, a sheet 34 as shown by a broken line in FIG. 9 was produced. The sheet 34 was a laminate having the following configuration.

PET film/aluminum foil/adhesive layer/copper sputtering film/PEN film

A symbol "/" means that layers on both sides of the symbol "/" are bonded to each other.

The PET film is a model of the resin film 28 of the sealing member 14. The thickness of the PET film was 38 μm. The aluminum foil is a model of the metal foil 24 of the sealing member 14. The thickness of the aluminum foil was 30 μm. The adhesive layer is formed of an adhesive and is a model of the adhesive layer 26 of the sealing member 14. The thickness of the adhesive layer was 26 μm. The copper sputtering film is a model of the electrode layer, for example, a model of the cathode layer 22. The PEN film is a support film of a copper sputtering film. The thickness of the PEN film was 100 μm.

The sheet 34 was cut by the cutter provided with the cutting blade 32 having corners as shown in FIG. 8, and a cut member 36 shown by a solid line in FIG. 9 was separated from the sheet 34. A plan view shape of the cut member 36 was a square. When a conduction test of an aluminum foil and a copper sputtering film of the cut member 36 was conducted, the aluminum foil and the copper sputtering film were conducting.

Figure 10:
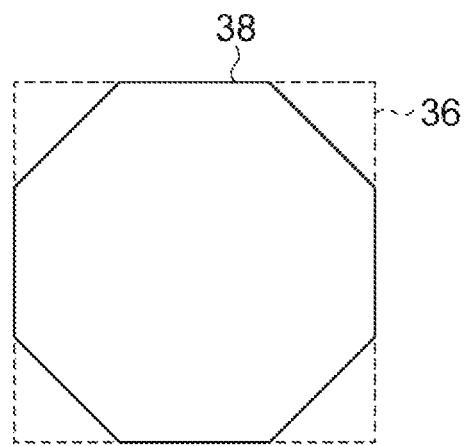
FIG. 10 is a drawing for explaining the verification experiment.

Next, the cut member 36 in a state rotated by 45 degrees with respect to the cutting blade 32 was set to the cutter used for cutting the sheet 34 to obtain the cut member 36, and the cut member 36 was cut by the cutting blade 32. As a result, the cut member 36 was cut at a portion other than the corner of the cutting blade 32, and as shown in FIG. 10, a cut member 38 in which the corner of the cut member 36 was cut was obtained. In FIG. 10, the cut member 36 is shown by a broken line for the sake of description. When the conduction test performed on the cut member 36 was performed on the cut member 38, the aluminum foil and the copper sputtering film were not conducted.

It is understood from the results of the above verification experiment that the aluminum foil and the copper sputtering film were in contact with each other at the corner of the cut member 36, and that conduction occurred between them.

Thus, it can be understood that when the sealing member 14 is bonded to the device substrate 12 in the bonding step S02, if the sealing member 14 covers the corners c1 to c4 of the device formation region DA, the metal foil 24 is in contact with the anode layer and the cathode layer at the corner of the organic EL device obtained by cutting with the cutting blade 32, and the anode layer and the cathode layer may short circuit through the metal foil 24. On the other hand, since the contact between the metal foil 24 and the anode layer 18 and the cathode layer 22 is prevented unless the vicinity of the corners c1 to c4 is covered with the sealing member 14, it could be verified that the short circuit between the anode layer 18 and the cathode layer 22 through the metal foil 24 could be suppressed.

In the dicing step S03, in a mode in which the cutting blade 32 is advanced from the sealing member 14 side, the adhesive layer 26 is pressed toward the device substrate 12 as the cutting blade 32 enters. Thus, it is possible to prevent the sealing member 14 from peeling from the device substrate 12 in the dicing step S03.

In particular, when an adhesive used for the adhesive layer 26 is a pressure-sensitive adhesive that adheres by application of pressure and has flexibility without being hardened even after adhesion, the pressure-sensitive adhesive adheres the sealing member 14 and the device substrate 12 with pressure applied when the cutting blade 32 enters, and, at the same time, it is possible to suppress peeling of the metal foil 24 and the pressure-sensitive adhesive when the cutting blade 32 retracts.

The present invention is not limited to the various illustrated embodiments. The scope of the present invention is defined by the claims, and equivalence of and any modification within the scope of the claims are intended to be included therein.

In the bonding step S02, as shown in FIGS. 6 and 7, the sealing member 14 having the opening 14a was used. However, the sealing member 14 may be bonded to the device substrate 12 such that the sealing member 14 is not disposed at the corners c1 to c4 of the device formation region DA.

For example, as shown in FIG. 11, the elongated sealing member 14 which has a width shorter than the width of the device formation region DA (length in the direction orthogonal to the extending direction) and longer than the width of the organic EL portion 20 and has no opening formed therein may be bonded for each of the device formation region rows. In this case, since the opening 14a may not be formed in the sealing member 14, the sealing member 14 can be easily produced, and the sealing member 14 can be easily aligned with the device substrate 12. In FIG. 11, as in FIGS. 6 and 7, the sealing member 14 is hatched to clearly show the sealing member 14, and illustration of the anode layer 18, the organic EL portion 20, and the cathode layer 22 provided in the device substrate 12 is omitted.

The sealing base may not be a metal foil but may be, for example, a barrier film in which a barrier functional layer is formed on a front or back or both surfaces of a transparent plastic film, a flexible thin film glass, or a film in which a metal having a barrier property is laminated on a plastic film.

In the dicing step, it suffices that the device formation region can be separated from a device formation substrate which has been subjected to the bonding step. For example, with an outer edge (boundary) of the device formation region as a cutting line, the device formation region may be diced along the cutting line while moving a thin plate (or knife-like) cutting blade instead of a frame-like cutting blade. Alternatively, the dicing step may be performed using laser processing.

The shapes of the anode layer and the cathode layer are not limited to the illustrated mode. For example, the anode layer and the cathode layer may have a shape that the anode layer and the cathode layer are not disposed near the corner of the organic EL device. Even in this case, the sealing member is not disposed at the corner of the organic EL device, so that it is possible to suppress inconvenience such as peeling of the sealing member when the organic EL device is dropped from the corner.

The support substrate used in the manufacturing method for the organic EL device may not be an elongated support substrate, but may be a sheet-like support substrate. In the device substrate manufacturing step, if a support substrate on which an anode layer is formed in advance is prepared, the device substrate manufacturing step may not have the anode layer forming step.

Although the anode layer is illustrated as the first electrode layer and the cathode layer is illustrated as the second electrode layer, the first electrode layer may be a cathode layer, and the second electrode layer may be an anode layer. That is, the cathode layer may be disposed on the support substrate (flexible substrate) side.

The shape of the organic EL device (and the device formation region) is not limited to a quadrilateral shape such as a square or a rectangle, and any shape is acceptable as long as the shape has at least one corner.

In the above embodiment, the manufacturing method for the organic EL device, which is an example of an organic electronic device, has been described. However, the present invention can also be applied to a manufacturing method for an organic electronic device using an organic substance as a material, such as an organic thin-film transistor, an organic photodetector, an organic sensor, or an organic thin-film solar cell in addition to the organic EL device.

REFERENCE SIGNS LIST

10 Organic EL device (organic electronic device)
12 Device substrate
14 Sealing member
16 Support substrate
18 Anode layer (first electrode layer)
20 Organic EL portion (device function portion including organic layer)
22 Cathode layer (second electrode layer)
24 Metal foil (sealing base)
26 Adhesive layer
32 Cutting blade
c1, c2, c3, c4 Corner
DA Device formation region

The invention claimed is:

1. A manufacturing method for an organic electronic device, comprising:
   a device substrate manufacturing step of manufacturing a device substrate in which a first electrode layer, a device function portion including an organic layer, and a second electrode layer are sequentially laminated in each of a plurality of device formation regions virtually set in a flexible support substrate and having at least one corner;
   a bonding step of bonding a sealing member including a sealing base and an adhesive layer laminated on the sealing base to a side of the second electrode layer of the device substrate via the adhesive layer such that the sealing member is not disposed at the corner of the device formation region; and
   a dicing step of dicing the device substrate, to which the sealing member is bonded, for each of the device formation regions to obtain the organic electronic device; and
   wherein the sealing member has an opening at a position facing the corner of the device formation region.

2. The manufacturing method for an organic electronic device according to claim 1, wherein in the dicing step, the device substrate to which the sealing member is bonded is cut for each of the device formation regions by a cutting blade having a shape corresponding to a shape of the device formation region.

3. The manufacturing method for an organic electronic device according to claim 1, wherein
in the dicing step, a cutting blade is advanced from a side of the sealing member to a side of the support substrate of the device substrate to which the sealing member is bonded.

4. The manufacturing method for an organic electronic device according to claim 1, wherein
the sealing base is a metal foil.

5. The manufacturing method for an organic electronic device according to claim 1, wherein when four corners of the device formation region of the device substrate are referred to as a first corner, a second corner, a third corner, and a fourth corner, the first to fourth corners are arranged in order of the first corner, the second corner, the third corner, and the fourth corner around a circumferential direction of the device formation region,
a portion of the first electrode layer is disposed at each of the first corner and the fourth corner, and
a portion of the second electrode layer is disposed at each of the second corner and the third corner.

6. The manufacturing method for an organic electronic device according to claim 1, wherein
a plan view shape of the device formation region is quadrilateral.

7. The manufacturing method for an organic electronic device according to claim 1, wherein
the support substrate extends in one direction,
the plurality of device formation regions are arranged along the one direction of the support substrate, and
in the bonding step, the sealing member in which a length in a direction orthogonal to the one direction of the support substrate is shorter than a length of the device formation region is bonded to the device substrate.

* * * * *